(12) United States Patent
Singh

(10) Patent No.: US 7,843,030 B2
(45) Date of Patent: Nov. 30, 2010

(54) METHOD, APPARATUS, MATERIAL, AND SYSTEM OF USING A HIGH GAIN AVALANCHE PHOTODETECTOR TRANSISTOR

(76) Inventor: Ranbir Singh, 42652 Jolly La., South Riding, VA (US) 20152

(*) Notice: Subject to any disclaimer, the term of this patent is extended or adjusted under 35 U.S.C. 154(b) by 473 days.

(21) Appl. No.: 11/689,524

(22) Filed: Mar. 22, 2007

(65) Prior Publication Data
US 2008/0230862 A1 Sep. 25, 2008

(51) Int. Cl.
H01L 31/101 (2006.01)
(52) U.S. Cl. .......... 257/462; 257/E29.18; 257/E31.063
(58) Field of Classification Search ........... 257/186, 257/187, 198, 199, 436, 438, 461, 462, 603, 257/605, E29.174, 29.18, E29.183, E31.063
See application file for complete search history.

(56) References Cited

U.S. PATENT DOCUMENTS

| 4,353,081 A | 10/1982 | Allyn et al. |
| 4,833,512 A | 5/1989 | Thompson |
| 5,311,047 A | 5/1994 | Chang |
| 5,343,054 A * | 8/1994 | Maroney et al. ............ 257/184 |
| 5,384,469 A | 1/1995 | Choi |
| 5,394,005 A | 2/1995 | Brown et al. |
| 5,457,331 A * | 10/1995 | Kosai et al. ................ 257/188 |
| 5,589,682 A | 12/1996 | Brown et al. |
| 5,602,413 A * | 2/1997 | Morishita ................... 257/438 |
| 6,137,123 A | 10/2000 | Yang et al. |
| 6,229,150 B1* | 5/2001 | Takayama et al. ............ 257/12 |
| 6,455,872 B1 | 9/2002 | Williams et al. |
| 6,465,803 B1* | 10/2002 | Bowers et al. ................ 257/21 |
| 6,573,128 B1 | 6/2003 | Singh |
| 6,614,086 B2* | 9/2003 | Kim et al. ................... 257/438 |
| 6,838,741 B2 | 1/2005 | Sandvik et al. |
| 6,849,866 B2 | 2/2005 | Taylor |
| 6,965,123 B1 | 11/2005 | Forbes et al. |
| 7,026,669 B2 | 4/2006 | Singh |
| 2004/0251483 A1* | 12/2004 | Ko et al. ..................... 257/292 |
| 2008/0203425 A1* | 8/2008 | Sulima ........................ 257/185 |

* cited by examiner

*Primary Examiner*—Evan Pert
*Assistant Examiner*—W. Wendy Kuo
(74) *Attorney, Agent, or Firm*—Andrew Bodendorf

(57) ABSTRACT

Here, we demonstrate new material/structures for the photodetectors, using semiconductor material. For example, we present the Tunable Avalanche Wide Base Transistor as a photodetector. Particularly, SiC, GaN, AlN, Si and Diamond materials are given as examples. The desired properties of an optimum photodetector is achieved. Different variations are discussed, both in terms of structure and material.

14 Claims, 9 Drawing Sheets

| Material | Light Output [Photons/MeV] | Wavelength of Maximum Emission [nm] | Decay Lifetimes [ns] | Attenuation Length (511 keV) [cm] |
|---|---|---|---|---|
| NaI(Tl) | 38,000 | 415 | 230 | 3.0 |
| LaBr$_3$ (0.5% Ce) | 74,000 | 370 | 26 | 2.1 |
| CeBr$_3$ | 68,000 | 370 | 17 | 2.1 |
| LaBr$_{2.4}$I$_{0.6}$ (0.5% Ce) | 30,000 | 450 | 33,360 | 1.9 |
| LaBr$_{1.5}$Cl$_{1.5}$ (10% Ce) | 68,000 | 380 | 20 | 2.4 |
| LaBr$_3$ (1% Eu$^{2+}$) | 10,000 | 430 | 90,560 | 2.1 |
| LaBr$_3$ (1% Pr$^{3+}$) | 85,000 | 610* | 11,000 | 2.1 |

\* - weighted mean

Fig. 3    (prior art)

METHOD, APPARATUS, MATERIAL, AND SYSTEM OF USING A HIGH GAIN AVALANCHE PHOTODETECTOR TRANSISTOR

BACKGROUND OF THE INVENTION

Terrorist use of radioactive nuclear materials is a serious threat for mass destruction or disruption of civil and military activities. Most worrisome is the use of nuclear devices that may cause massive casualties to people and damage to structures. A device that combines radioactive materials with conventional explosives to make a radiological dispersion device is commonly called a "dirty bomb." The procurement of nuclear materials for this purpose, the construction of the bomb, and its use are all easier than those of a nuclear weapon. Thus, it is important to detect the transport of the radiological dispersion devices and the materials needed for their construction. These materials emit gamma rays or neutrons, which can be detected to show the presence and amounts of such materials using radiation detectors.

High-efficiency gamma-ray and neutron detectors are required to provide information to intercept nuclear materials and devices prior to an attack, as well as for radiation assessment and attribution after an attack. Desirable properties of radiation detectors are:

High detection efficiency over a wide energy range
High optical (and electrical) gain in the specified range
Low background noise
Large dynamic range (speed) and linearity
Low operating bias voltages
Robust design for a wide operating temperature range.

Some other usages of the detectors are for jet and rocket engine flame detection, medical imaging, astronomy, and oil drilling.

The three commonly-used classes of detectors for Ultra Violet (UV), deep UV, X-rays and gamma rays are: (a) scintillation crystals coupled to photodetectors or photomultiplier (PM) tubes (as shown in FIG. 1), (b) high pressure ionizing gas-based detectors, and (c) semiconductor detectors.

The most common scintillation detector is NaI(Tl), usually coupled to a PM tube. NaI detectors have relatively poor energy resolutions. This limits their use in high background situations, or for unknown sources with many closely-spaced peaks. Gamma-ray peaks from a weak source will be difficult to observe in a relatively high background environment, and peaks that differ by a few percent in energy will usually be unresolved. Similarly, Gas-based detectors have poor resolution, and are bulky with poor vibration performance.

An excellent solution for Gamma ray detectors is to couple modem Ce-based scintillator crystals with room/high temperature semiconductor photodetectors, which can replace the function of the PM tube. Modem $LaBr_3$ and $CeBr_3$ scintillators emit radiation in the 320-440 nm range, as shown in FIG. 2. These crystals offer excellent decay lifetimes and reasonable detector lengths, as well as excellent light output (>68000 Photon/MeV), as shown in FIG. 3.

Semiconductor radiation detectors have unique capabilities and provide superior performance in many respects over other kinds of detectors. The energy resolution achieved with semiconductor-based detectors is superior to that of other technologies. The faster charge-collection times of solid-state detectors provide them with the ability to process higher counting rates. Their compactness allows the measurement of intensity variations over small distances. Furthermore, the semiconductor detectors can be efficient, compact, and rugged.

Germanium (Ge) semiconductor diodes are the gold standard for the gamma-ray detectors, with resolutions of typically 1.3 keV (0.2%) at 662 keV. This allows precise determination of peak energies, separation of close-lying peaks, and detection of weak peaks in the presence of a strong background. Ge detectors have the disadvantage that they must be operated at low temperatures (less than 100 K) to avoid electronic noise, which is an obvious and severe logistical problem. Some of the prior art references/research groups related to this technology are listed here:

U.S. Pat. No. 5,394,005, Brown et al., describing SiC photodiode, from GE
U.S. Pat. No. 5,589,682, Brown et al., describing photocurrent detector, from GE
U.S. Pat. No. 6,573,128, Singh, describing SiC Schottky devices, from Cree
U.S. Pat. No. 6,838,741, Sandvik et al., describing avalanche photodiode, from GE
U.S. Pat. No. 7,026,669, Singh, describing lateral channel transistor
U.S. Pat. No. 6,849,866, Taylor, describing optoelectronic devices, from U. of Connecticut
U.S. Pat. No. 6,455,872, William et al., describing photodetector, from Hitachi
U.S. Pat. No. 5,384,469, Choi, describing voltage tunable multicolor infrared detectors, from US Army
U.S. Pat. No. 4,833,512, Thompson, describing heterojunction photodetector with transparent gate, from ITT
U.S. Pat. No. 4,353,081, Allyn et al., describing graded bandgap rectifying semiconductor devices, from Bell Labs
U.S. Pat. No. 6,965,123, Forbes et al., describing SiC devices, from Micron Tech.
U.S. Pat. No. 6,137,123, Yang et al., describing GaN heterojunction phototransistor, from Honeywell
U.S. Pat. No. 5,311,047, Chang, describing amorphous Si/SiC heterojunction color-sensitive phototransistor, from Taiwan, National Science Council
Hans Rabus, from Physikalisch-Technische Bundesanstalt
Peter Sandvik and Emad Andarawis, from GE Global Research

SUMMARY OF THE INVENTION

Here, we demonstrate new structure for a photodetector using various semiconductor materials. For example, we present the Wavelength-Tunable Wide-Base Avalanche Photodetector Transistor. Particularly, we look at a suitable bandgap material as an embodiment (example), such as Si, GaN, SiC, AlN, AlGaN diamond, a binary, ternary, or a higher combination, or any semiconductor in the bandgap range of 1-8 eV. However, any semiconductor outside that range is still included because it would perform substantially or more or less the same.

A superior material for semiconductor photodetectors should have the following properties, as an embodiment/example:

1. A large bandgap, to allow operation at room temperature (high temperatures), without thermally generated noise;
2. High electron and hole mobilities, and higher saturation velocities, which lead to fast signal collection;
3. High resistivity, so that a low voltage depletes a large volume of charge-collection region;
4. A low dielectric constant, which lowers the capacitance and, therefore, the noise;
5. Monocrystalline to have a good charge-collection efficiency;

6. High thermal conductivity to have good cooling properties;

7. Commercial availability.

It is worth noting that Si, GaN, SiC, or another wide bandgap material offers significant advantages as a material of choice for realizing photonic detectors because: (a) the detectors offer excellent SNR (good relative signal) even at higher temperatures, because the detector diodes offer negligible leakage current, resulting from thermally generated charge carriers; and (b) Another potential advantage is its higher temporal resolution. Since it has a high breakdown field devices may be operated under a large applied electric field. Furthermore, charge carriers may move at higher saturation velocities, thus, achieving very fast output current signals.

One of the essential features of this invention is that the avalanche current of the photodetector is enhanced by the gain of the transistor, which depends on the width of the undepleted wide-base region of the transistor. This enables the photodetector to have a more uniform and reasonably low operating avalanche bias voltage, and high optical to electrical gain.

Another feature is the control of the wavelength of absorption through the control of the doping of the emitter or the top region of the structure. This allows wider applicability to various frequencies of light using the same basic structure. Therefore, it is more cost effective for production or manufacturing.

BRIEF DESCRIPTION OF THE FIGURES

FIG. 3. Light output, emission wavelength, decay lifetimes, and attenuation length of the state-of-the-art scintillators.

DETAILED DESCRIPTION OF THE PREFERRED EMBODIMENTS

Figure 1:
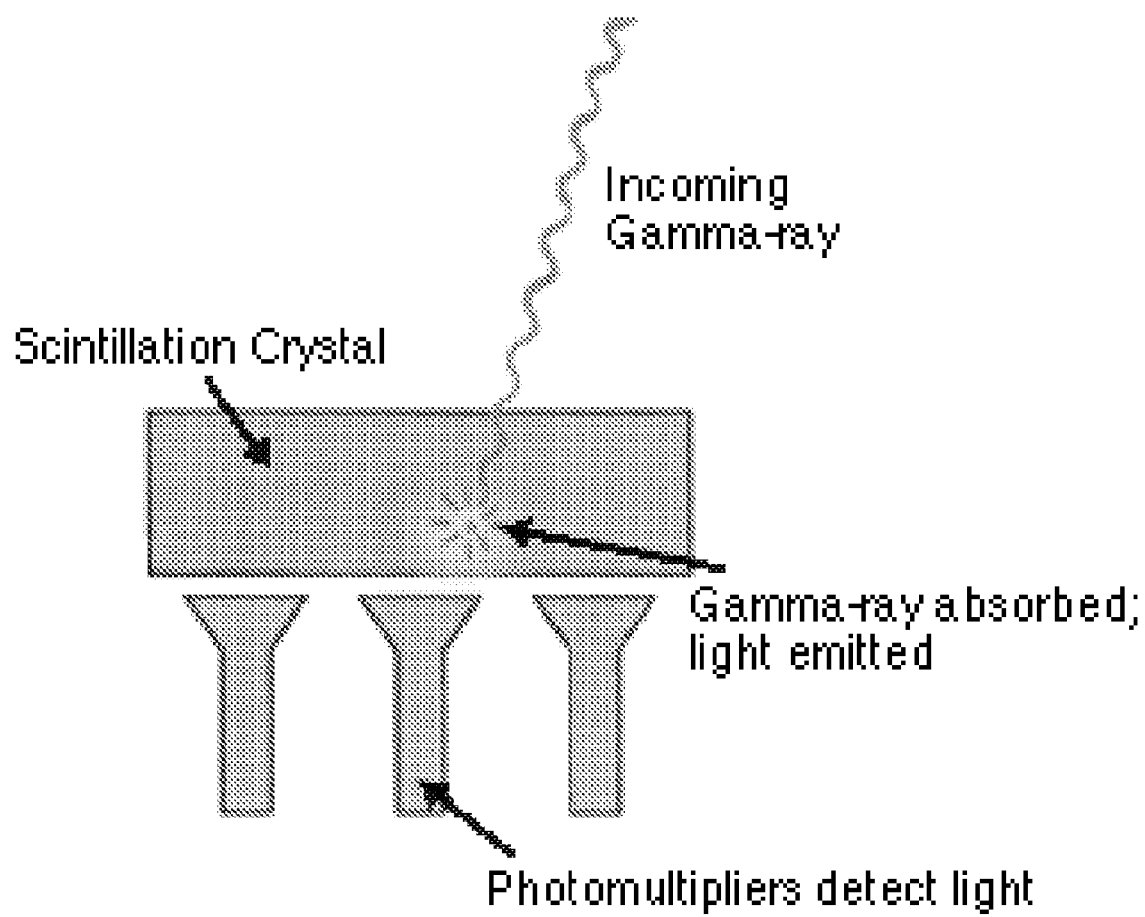
FIG. 1. Construction of typical Gamma ray detector, with scintillation crystal, that produces UV/visible light, and photon detectors (PMT solution).
Figure 2:
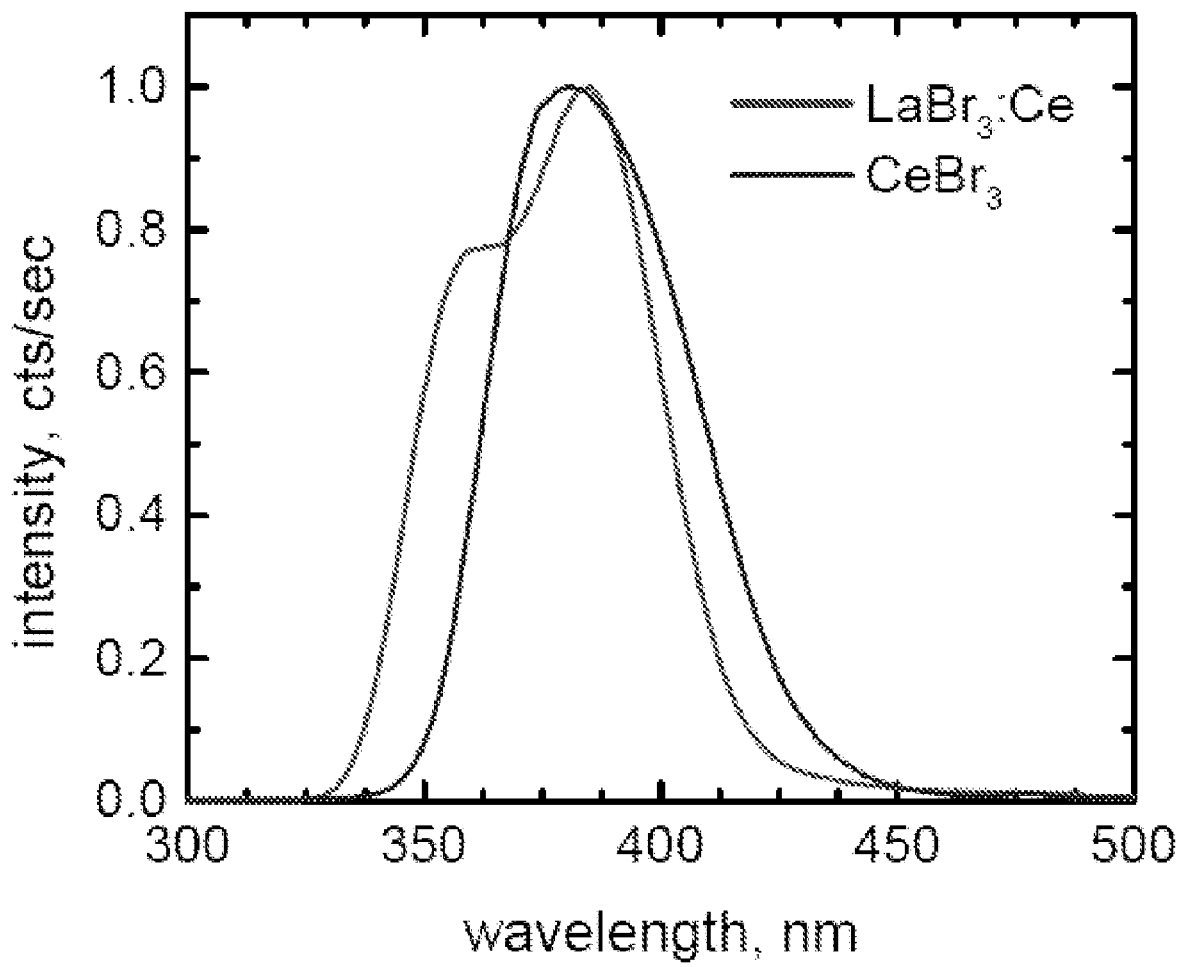
FIG. 2. Light emission spectra from the state-of-the-art scintillator crystals: Cerium-doped $LaBr_3$ and $CeBr_3$.
Figure 4:
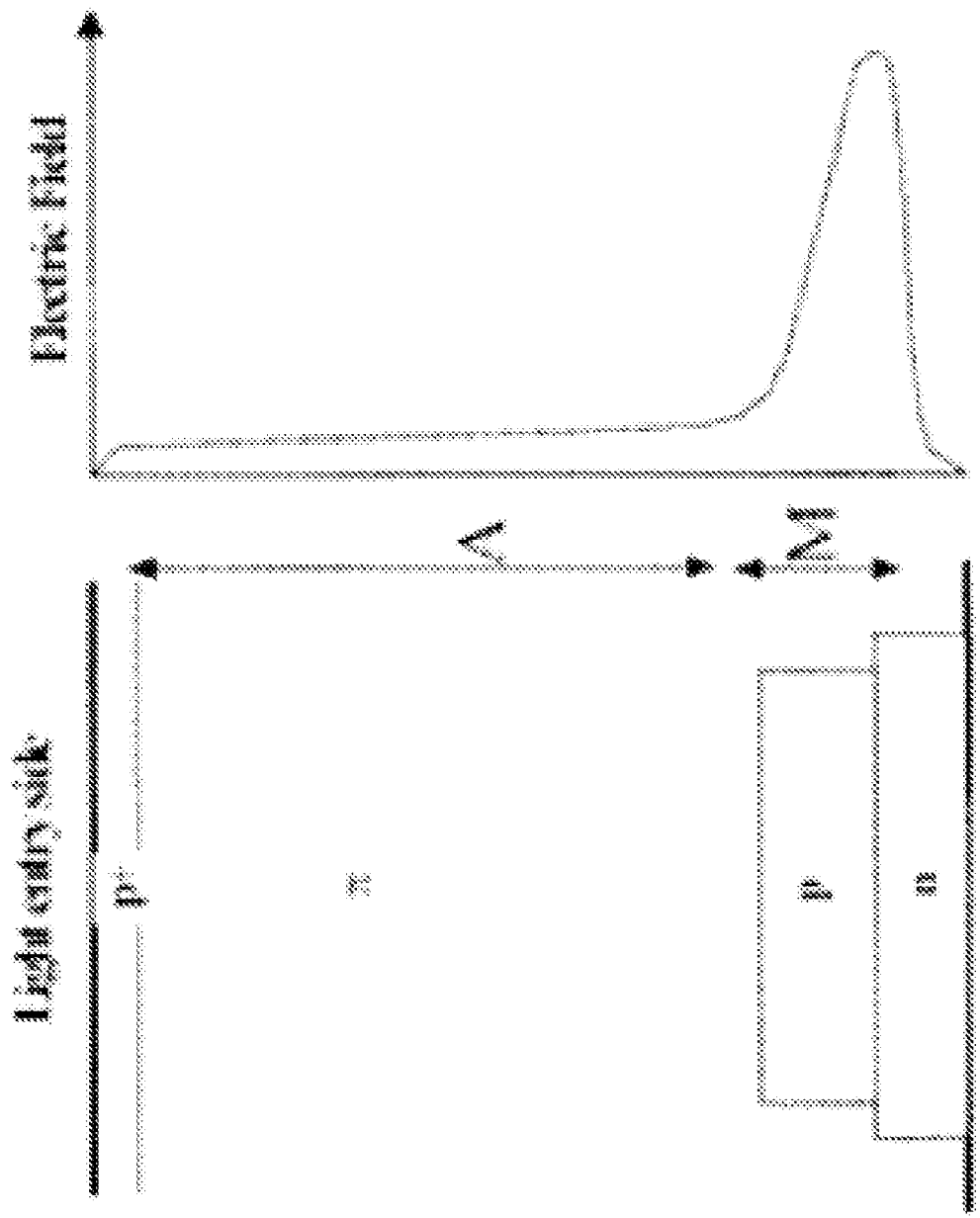
FIG. 4. Construction of Separate Absorption and Mulitplication regions for avalanche Photodiodes: It is wide-based, to absorb the incident photons (and convert them into electrons), and it has a high electric field region to create a localized avalanche region to produce uniformly-controlled avalanche voltage.
Figure 5:
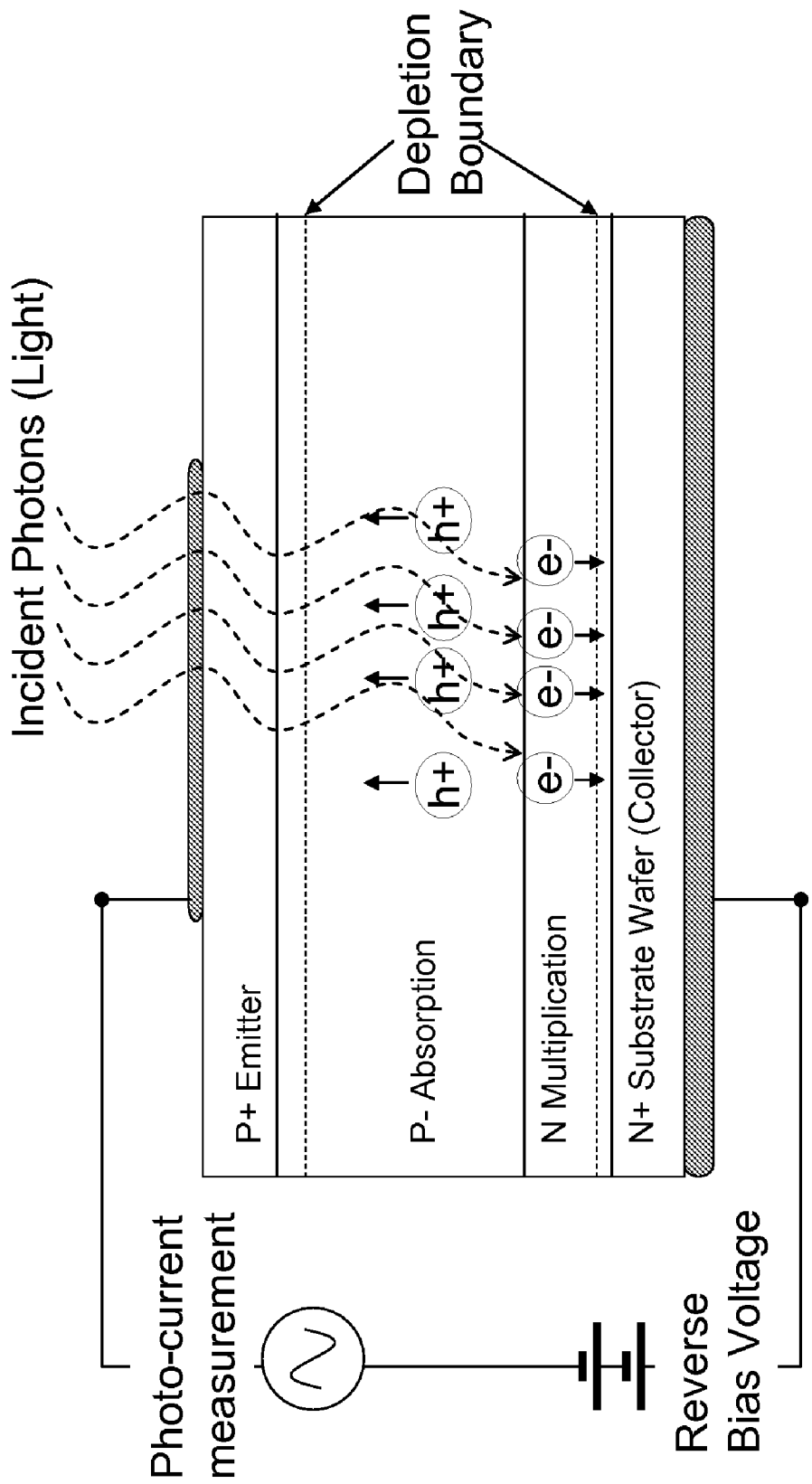
FIG. 5. A typical design of photodiode, consisting of the P-epitaxial layer, which governs the photon collection and bias voltage, while N-multiplication region determines the optical gain, during avalanche multiplication. The P-layer is the absorption layer, and the top P layer is the emitter layer. The purpose: Electric field should be high in the multiplication region, which is separated from the thick low-doped photon absorption region. The avalanche does not occur in the low doping area of the absorption region.

Here are some of the improvements on the design and structure:

Not only we have separated the regions as described in FIG. 5, we have used the transistor structure for higher gain, as described above. Instead, the avalanche only occurs in the multiplication region, thus, causing better uniformity for different devices. However, higher doped Multiplication region of the photodiode may not be required in the phototransistor, because multiplication is going to occur in that undepleted region of the transistor anyway. The avalanche multiplication process is further enhanced by the gain of the transistor which increases exponentially with the operating bias.

Figure 8:
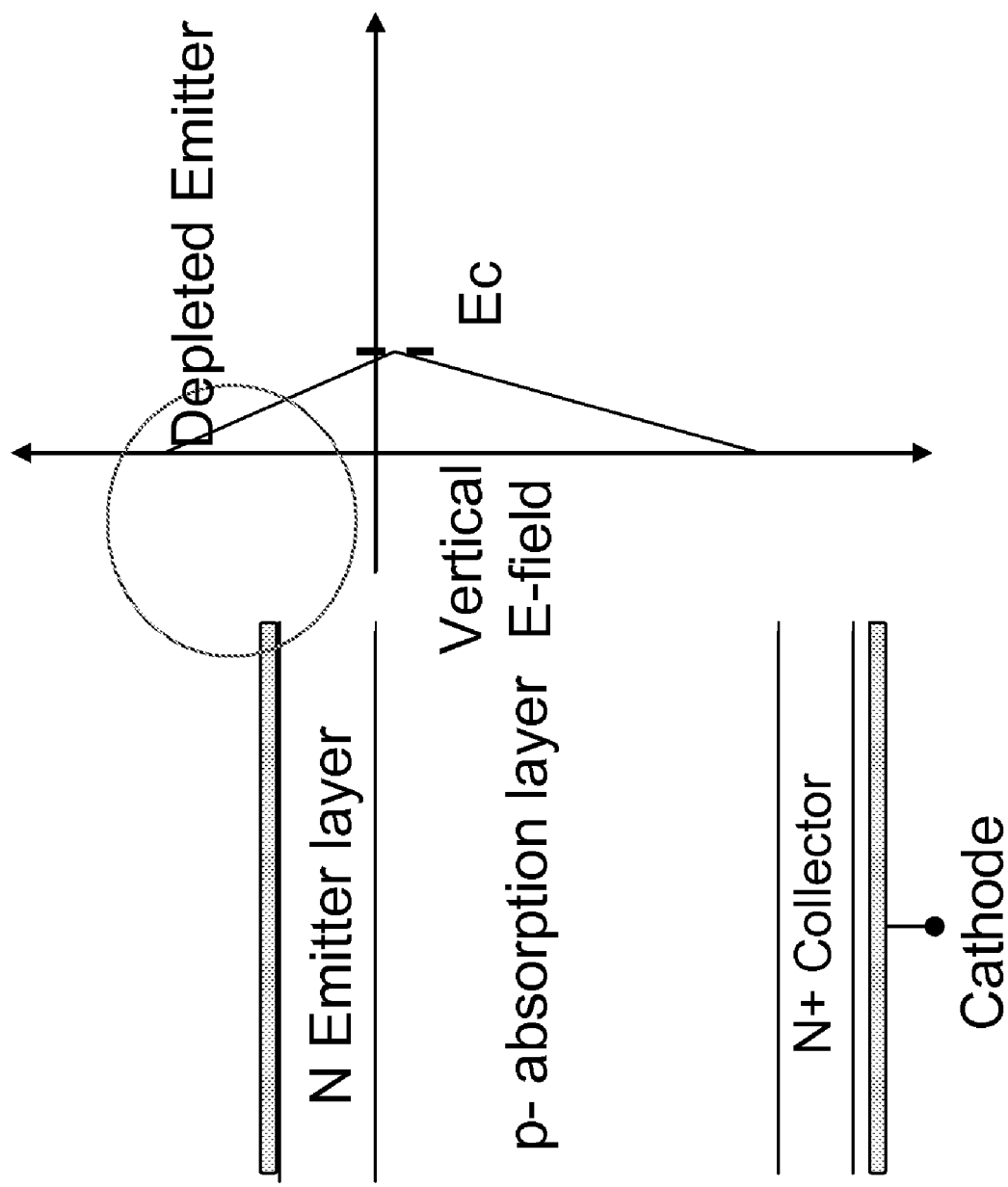
FIG. 8. The Electric field corresponding to a proposed structure which shows a fully depleted Emitter region. This allows tuning of the Photodetector to the wavelength of absorption.
Figure 9:
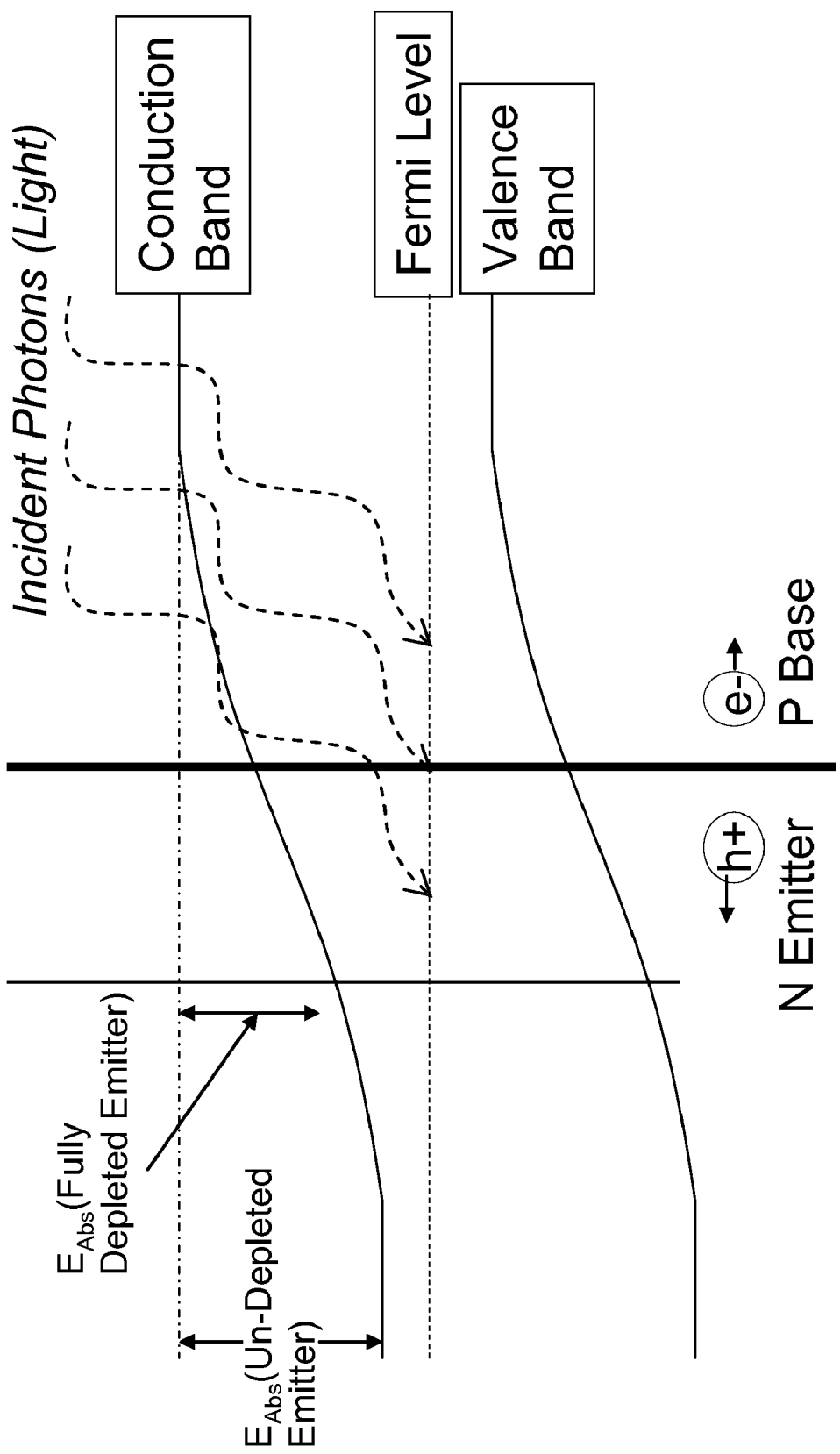
FIG. 9. The Absorption Energy of photons may be tuned by controlling the doping and thickness of the Emitter region. This figure shows the band diagram of the Emitter-Base region with undepleted emitter case, which corresponds to the highest energy of absorption for a given material, and a fully-depleted case, which corresponds to a lower energy of absorption.

FIG. 8 indicates the Electric field corresponding to a proposed structure.

As an embodiment, only 2 terminals are electrically connected to an external biasing and/or detection circuit. The two terminals are emitter and collector (or anode and cathode).

One of the problems with semiconductor devices is the non-uniformity across the devices or regions of the substrate. The other problem is the non-uniformity for the avalanche voltage at the edges, which can be solved by 3 methods:

(1) Junction Termination Extension (JTE) (i.e. using low-doped regions on the sides of the top layer, e.g. using P–layers (using for example ion implantation) around P+ top layer), (2) Guard Rings (i.e. using rings on the surface, with the high dose implantation), or (3) Step-wise Reduction in the Top Layer (i.e. reducing the thickness of the top layer in multiple steps, as it gets further away from the center of the top layer's contact).

Figure 6:
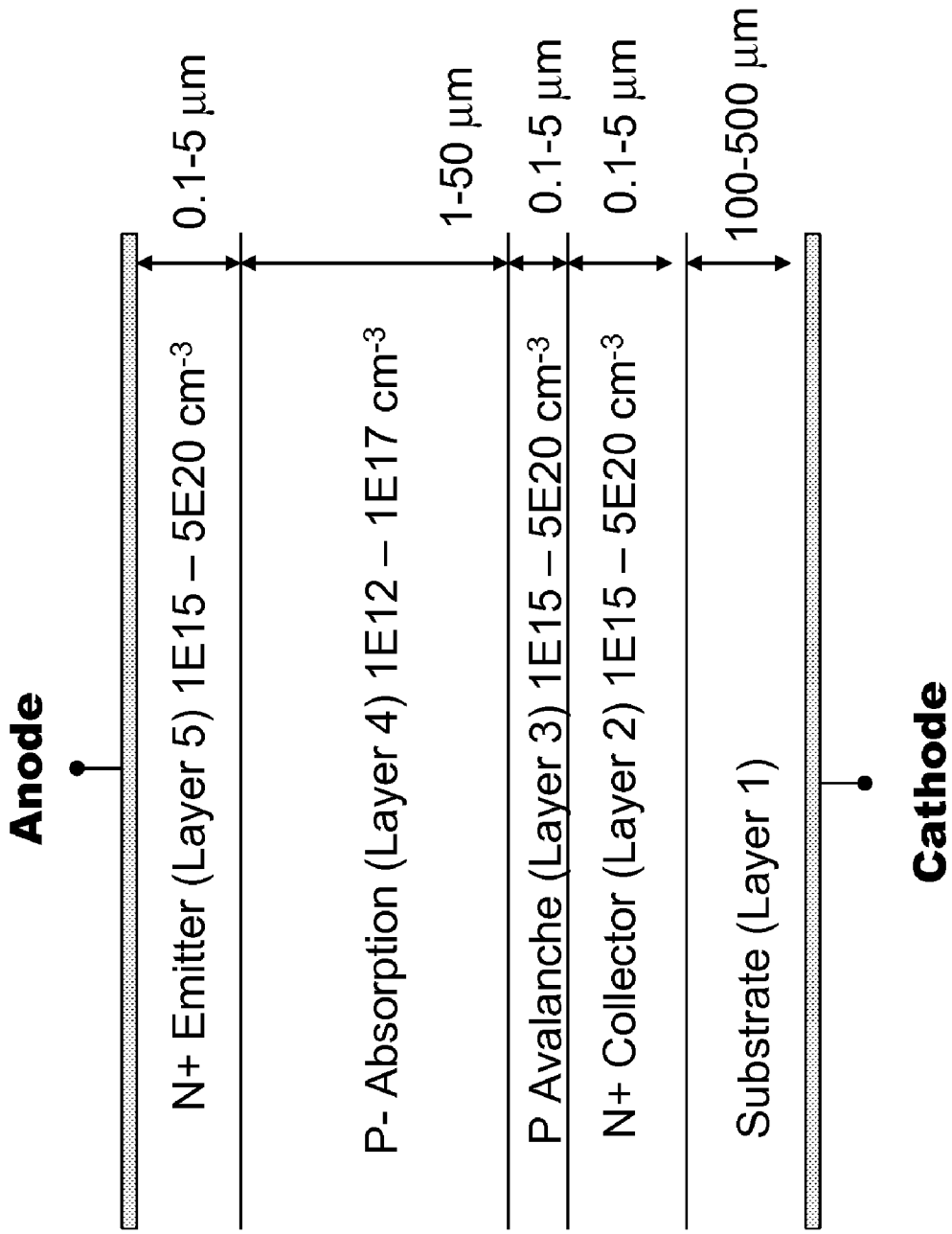
FIG. 6. Epitaxial structure of one of the examples/embodiments, for the Wide base Avalanche PhotoTransistor. The ranges of dopings and thicknesses are typical, and other values also work substantially or more or less the same.
Figure 7:
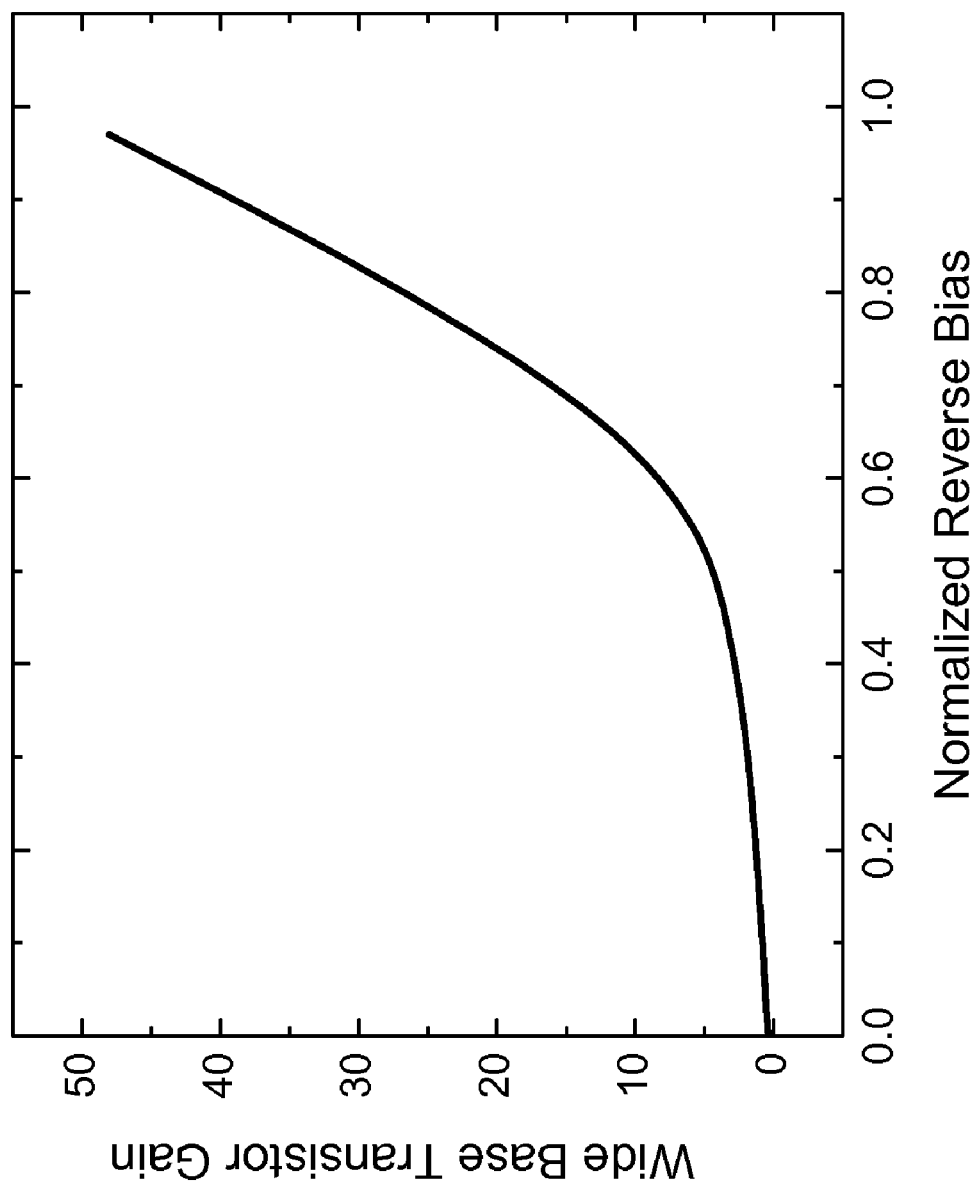
FIG. 7. The relationship between wide base transistor gain and normalized applied reverse bias. An increasing bias results in an increasing transistor gain, which is multiplied with the avalanche (signal) current in a wide base avalanche phototransistor.

An example of a good principle towards the epitaxial design of a phototransisitor is the one that utilizes the gain as well as separates the charge absorption region from the charge multiplication region is shown in FIG. 6. A simple example of an epitaxial design is shown in FIG. 6. In FIG. 6, as an embodiment, the Layer 1 is N+ layer, and the Layer 3 is an optional layer, where the gain is dependent on this layer thickness and doping. (Self-avalanching may be forced by the depletion region.)

In addition, the N+ Emitter layer may be fully depleted or may be undepleted. If undepleted, the photon absorption wavelength corresponds to the bandgap of the material used. This corresponds to the shortest wavelength that may be absorbed. Tunable higher wavelengths may be absorbed by reducing the doping/thickness below the critical levels determined by the following formula:

$$N_E W_E \leq \frac{\varepsilon E}{q}$$

Where $N_E$ is doping of the emitter (top) region, $W_E$ is the width of the emitter (top) layer, $\in$ is the dielectric constant of the semiconductor, q is the electron charge, and E is the maximum electric field at the emitter-base junction. The absorbed wavelength is given by:

$$E_{ABS}=hf$$

Where $E_{ABS}$ is the absorbed photon energy (which is the band offset of the Emitter-Base junction), f is the frequency of photons that are desired to be absorbed, and h is the Planck's constant. For a given material, the maximum absorbed energy is the bandgap of the material, which corresponds to highly doped Emitter and Base junction with undepleted Emitter region. The absorbed energy may be reduced by reducing the charge (doping and/or thickness) in the Emitter region, leaving a fully depleted Emitter region. This may require an Ohmic or a Schottky-type Emitter contact.

Detailed physics based on the 1D models is explored. These 1D models consist of the relevant physical formulae that tie basic material properties and physical device phenomenon to electrical parameters relevant to describe the behavior of the avalanche detectors. These physical models are then input into 2D Device simulation software and MathCAD and/or Excel to quantify the reverse-bias high temperature characteristics, as well.

The achievement of reasonable and repeatable bias voltage at which avalanche multiplication occurs is very important. The achievement of an extremely low doping in the Absorber layer is an important factor. A major advantage of the Avalanche phototransistor proposed here is that the gain of the wide-base transistor increases with an increasing applied bias. The transistor gain is multiplied to the avalanche current in the transistor, which allows a uniform avalanche bias, as well as increased photon to electron gain.

Some of the Preferred Embodiments

The two major features of our inventions presented here are:

1. The use of an avalanche Photo-transistor (N+P–N+), rather than a avalanche Photo-diode (P+P–N+ or P+N–N+), as the device to be used in photodetection application. One of the major disadvantages of using photodiodes in SiC is that the avalanche voltage is not uniform. This makes it nearly impossible to parallel several photodiodes, to create reasonable sized detector assemblies. A phototransistor allows electrical enhancement of photodetector signals through the internal gain of the transistor. Hence, a very controlled avalanche voltage may be obtained in a phototransistor, as compared to a photodiode.
2. Absorption of particular wavelength of photons may be tuned by controlling the N+ Emitter thickness/doping. In general, the bandgap of the material used to make the photodiode/phototransistor fundamentally determines the photon wavelength to be absorbed. SiC and GaN's absorption spectra are not exactly tuned to the emission spectra of modern scintillator materials. This poses a challenge towards achieving high photon-to-electron conversion. Here, the bandgap of the material used for construction of the phototransistor may be tuned (reduced) by reducing the doping and thickness of the N+ Emitter, by leaving a fully depleted emitter.

Any variations of the teachings above are also intended to be covered by the current application and patent.

The invention claimed is:

1. A photo detector transistor formed of a semiconductor, the transistor comprising:
    a substrate layer;
    a collector layer of the semiconductor formed on the substrate layering having a first conductivity type;
    an intermediate layer of one or more layers of the semiconductor having a second conductivity type formed on the collector layer;
    an emitter layer of the semiconductor of the first conductivity type formed on the intermediate layer of the second conductivity type;
    wherein the one or more layers includes an absorption layer of the second conductivity type having low doping configured to absorb photons of a particular wavelength and the collector layer and the emitter layer of the first conductivity type are highly doped and the doping of the absorption layer is lower than the doping of the collector layer and the emitter layer is fully depleted and a wavelength of photons absorbed by the transistor corresponds to the semiconductor.

2. The photo detector transistor of claim 1 wherein the first conductivity type is n type and the second conductivity type is p type.

3. The photo detector transistor of claim 1 wherein the one or more layers includes an avalanche layer of the second conductivity type formed between the collector layer and the absorption layer.

4. A photo detector transistor formed of a semiconductor, the transistor comprising:
    a substrate layer;
    a collector layer of the semiconductor formed on the substrate layering having a first conductivity type;
    an intermediate layer of one or more layers of the semiconductor having a second conductivity type formed on the collector layer;
    an emitter layer of the semiconductor of the first conductivity type formed on the intermediate layer of the second conductivity type;
    an anode formed on the emitter layer; and
    a cathode formed on the substrate, wherein the one or more layers includes an absorption layer of the second conductivity type configured to absorb photons of a particular wavelength and a current gain of the photo detector transistor increases with an operating bias applied between the anode and the cathode and a reduction in an un-depleted portion of the absorption layer with increasing bias increases the current gain.

5. The photo detector transistor of claim 1 wherein the emitter layer and the collector layer have a carrier concentration of dopant atoms of $1\times10^{15}$ cm$^{-3}$ to $1\times10^{20}$ cm$^{-3}$ and the absorption layer has a carrier concentration of dopant atoms of $1\times10^{12}$ cm$^{-3}$ to $1\times10^{17}$ cm$^{-3}$.

6. The photo detector transistor of claim 1 wherein a thickness of the emitter layer and collector layer are between 0.1 to 1.5 μm and a thickness of the absorption layer is between 1-50 μm.

7. The photo detector transistor of claim 3 wherein the emitter layer, the collector layer, and the avalanche layer have a carrier concentration of dopant atoms of $1\times10^{15}$ cm$^{-3}$ to $1\times10^{20}$ cm$^{-3}$ and the absorption layer has a carrier concentration of dopant atoms of $1\times10^{12}$ cm$^{-3}$ to $1\times10^{17}$ cm$^{-3}$.

8. The photo detector transistor of claim 7 wherein a thickness of the emitter layer, the collector layer, and the avalanche layer are between 0.1 to 1.5 μm and a thickness of the absorption layer is between 1-50 μm.

9. The photo detector transistor of claim 1 wherein the semiconductor has a bandgap greater than or equal to 2 eV and less than 8 eV.

10. The photo detector transistor of claim 1 wherein the semiconductor is one of silicon carbide, diamond, aluminum nitride, and gallium nitride.

11. The photo detector transistor of claim 1 wherein the semiconductor is SiC and the bandgap of the semiconductor is 3.2 eV and the full bandgap is used for energy absorption of photons.

12. A photo detector transistor formed of a semiconductor, the transistor comprising:

a substrate layer;

a collector layer of the semiconductor formed on the substrate layering having a first conductivity type;

an intermediate layer of one or more layers of the semiconductor having a second conductivity type formed on the collector layer;

an emitter layer of the semiconductor of the first conductivity type formed on the intermediate layer of the second conductivity type;

wherein the one or more layers includes an absorption layer of the second conductivity type configured to absorb photons and a doping of the emitter layer determines a wavelength of photons absorbed by the transistor and the doping is determined by:

$$N_E W_E \leq \frac{\varepsilon E}{q}$$

where $N_E$ is a doping of the emitter layer, $W_E$ is a width of the emitter layer, $\varepsilon$ is a dielectric constant of the semiconductor, q is electronic charge, and E is a maximum electric field at a junction of the emitter layer.

13. The photo detector transistor of claim 4 wherein the absorption layer of the second conductivity type is lowly doped and the collector layer and the emitter layer of the first conductivity type are highly doped and the doping of the absorption layer is lower than the doping of the collector layer.

14. The photo detector transistor of claim 12 wherein the absorption layer of the second conductivity type is lowly doped and the collector layer and the emitter layer of the first conductivity type are highly doped and the doping of the absorption layer is lower than the doping of the collector layer.

* * * * *